(12) United States Patent
Lin et al.

(10) Patent No.: US 8,179,516 B2
(45) Date of Patent: *May 15, 2012

(54) PROTECTIVE LAYER ON OBJECTIVE LENS FOR LIQUID IMMERSION LITHOGRAPHY APPLICATIONS

(75) Inventors: Burn Jeng Lin, Hsin-Chu (TW); David Lu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 764 days.

This patent is subject to a terminal disclaimer.

(21) Appl. No.: 11/548,551

(22) Filed: Oct. 11, 2006

(65) Prior Publication Data

US 2007/0091288 A1    Apr. 26, 2007

Related U.S. Application Data

(63) Continuation-in-part of application No. 10/702,664, filed on Nov. 6, 2003.

(51) Int. Cl.
*G03B 27/52* (2006.01)
*G03B 27/42* (2006.01)

(52) U.S. Cl. .......................... 355/30; 355/53
(58) Field of Classification Search .......... 355/53, 355/55, 67
See application file for complete search history.

(56) References Cited

U.S. PATENT DOCUMENTS

| | | | |
|---|---|---|---|
| 3,706,485 A | 12/1972 | Fawcett | |
| 4,500,611 A | 2/1985 | Nickol et al. | |
| 4,568,140 A | 2/1986 | van der Werf et al. | |
| 5,067,781 A | 11/1991 | Montanari et al. | |
| 5,121,256 A | 6/1992 | Corle et al. | |
| 5,139,879 A | 8/1992 | Aharoni et al. | |
| 5,494,743 A | 2/1996 | Woodard et al. | |
| 5,610,683 A | 3/1997 | Takahashi | |
| 5,648,860 A | 7/1997 | Ooi et al. | |
| 5,882,773 A | 3/1999 | Chow et al. | |
| 5,900,354 A | 5/1999 | Batchelder | |
| 6,084,846 A | 7/2000 | Jordache et al. | |
| 6,166,855 A | 12/2000 | Ikeyama et al. | |
| 6,191,429 B1 * | 2/2001 | Suwa | 250/548 |
| 6,417,974 B1 | 7/2002 | Schuster | |
| 6,556,353 B2 | 4/2003 | Omura | |
| 6,628,574 B1 | 9/2003 | Shimazaki et al. | |
| 7,129,009 B2 | 10/2006 | French et al. | |
| 2002/0163629 A1 | 11/2002 | Switkes et al. | |
| 2004/0027700 A1 * | 2/2004 | Yoshida | 359/883 |
| 2005/0007567 A1 | 1/2005 | Pierrat et al. | |
| 2005/0036183 A1 | 2/2005 | Yeo et al. | |

(Continued)

FOREIGN PATENT DOCUMENTS

| | | | |
|---|---|---|---|
| DE | 3537626 A1 | | 4/1986 |
| EP | 1172670 A2 | * | 1/2002 |
| JP | 2000-131503 | * | 12/2000 |

OTHER PUBLICATIONS

Translation of Suzuki (JP-A-2000-131503).*

(Continued)

*Primary Examiner* — Peter B Kim
(74) *Attorney, Agent, or Firm* — Haynes and Boone, LLP (57) ABSTRACT

Disclosed is an objective lens adapted for use in liquid immersion photolithography and a method for making such a lens. In one example, the objective lens has multiple lens elements, one of which includes a transparent substrate and a layer of protective coating (PC). The PC is formed proximate to the transparent substrate and is positioned between a liquid used during the liquid immersion photolithography and the transparent substrate to protect the transparent substrate from the liquid.

26 Claims, 7 Drawing Sheets

U.S. PATENT DOCUMENTS

2005/0068639 A1 3/2005 Pierrat et al.
2005/0094116 A1* 5/2005 Flagello et al. .................. 355/53
2005/0100745 A1* 5/2005 Lin et al. ........................ 428/446
2006/0001851 A1* 1/2006 Grant et al. ..................... 355/53

OTHER PUBLICATIONS

Hoffnagle, J.A., et al, "Liquid Immersion Deep-Ultraviolet Interferometric Lithography", J. Vac. Sci. Technol. B 17(6), Nov./Dec. 1999, pp. 3306-3309.

Swikes, M., et al., "Immersion Lithography at 157 nm", J. Vac. Sci. Technol. B 19(6), Nov./Dec. 2001, pp. 2353-2356.

Final Office Action issued Mar. 31, 2009 in related U.S. Appl. No. 10/702,664, filed Nov. 6, 2003, 13 pages.

Office Action issued in related U.S. Appl. No. 10/702,664, filed Nov. 6, 2003, mailed on Jul. 30, 2009, 9 pages.

Office Action issued in related U.S. Appl. No. 10/702,664, filed Nov. 6, 2003, mailed on Feb. 23, 2010, 7 pages.

* cited by examiner

PROTECTIVE LAYER ON OBJECTIVE LENS FOR LIQUID IMMERSION LITHOGRAPHY APPLICATIONS

The present disclosure is a continuation-in-part of U.S. Ser. No. 10/702,664 filed Nov. 6, 2003, the contents of which are hereby incorporated by reference.

BACKGROUND

The present disclosure relates generally to lenses for photolithography systems and, more particularly, to an objective lens for use in a liquid immersion lithography process.

The semiconductor integrated circuit (IC) industry has experienced rapid growth. Technological advances in IC materials and design have produced generations of ICs where each generation has more complex circuits than the previous generation. However, these advances have increased the complexity of processing and manufacturing ICs and, for these advances to be realized, similar developments in IC processing and manufacturing have been needed.

The growth of the semiconductor IC industry is driven by Moore's law: "The complexity of minimum component cost has increased at a rate of roughly a factor of two per year". In the course of integrated circuit evolution, functional density (i.e., the number of interconnected devices per chip area) has generally increased while feature size (i.e., the smallest component or line that can be created using a fabrication process) has decreased. This scaling down process generally provides benefits by increasing production efficiency and lowering associated costs.

One of the factors enabling the continued minimization of feature size is improvement in photolithography and its ability to print smaller features. The minimum feature size in an optical lithography system may be determined in part by diffraction, which is related to the wavelength of light and the medium through which the light shines. Accordingly, one approach to reducing feature size and improving resolution is to use light with a shorter wavelength. Another approach is to use a medium between the lens and the substrate other than air. Since the index of refraction of a medium (referred to as 'n') is larger than one, the wavelength in the medium is reduced by the factor of n. This may improve resolution.

One such method of enhancing resolution using a non-air medium is referred to as immersion lithography. Depending on the inserted medium, immersion lithography may be classified as solid immersion lithography or liquid immersion lithography. However, in liquid immersion lithography, there may be chemical reaction and physical damage between an optical lens used during lithography and the liquid used for immersion. Such a chemical reaction or other mechanism may damage the optical system and degrade the system's resolution.

Accordingly, what is needed is an improved optical lens and method of manufacturing such a lens.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to lenses for photolithography systems and, more particularly, to an objective lens for use in a liquid immersion lithography process. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 1:
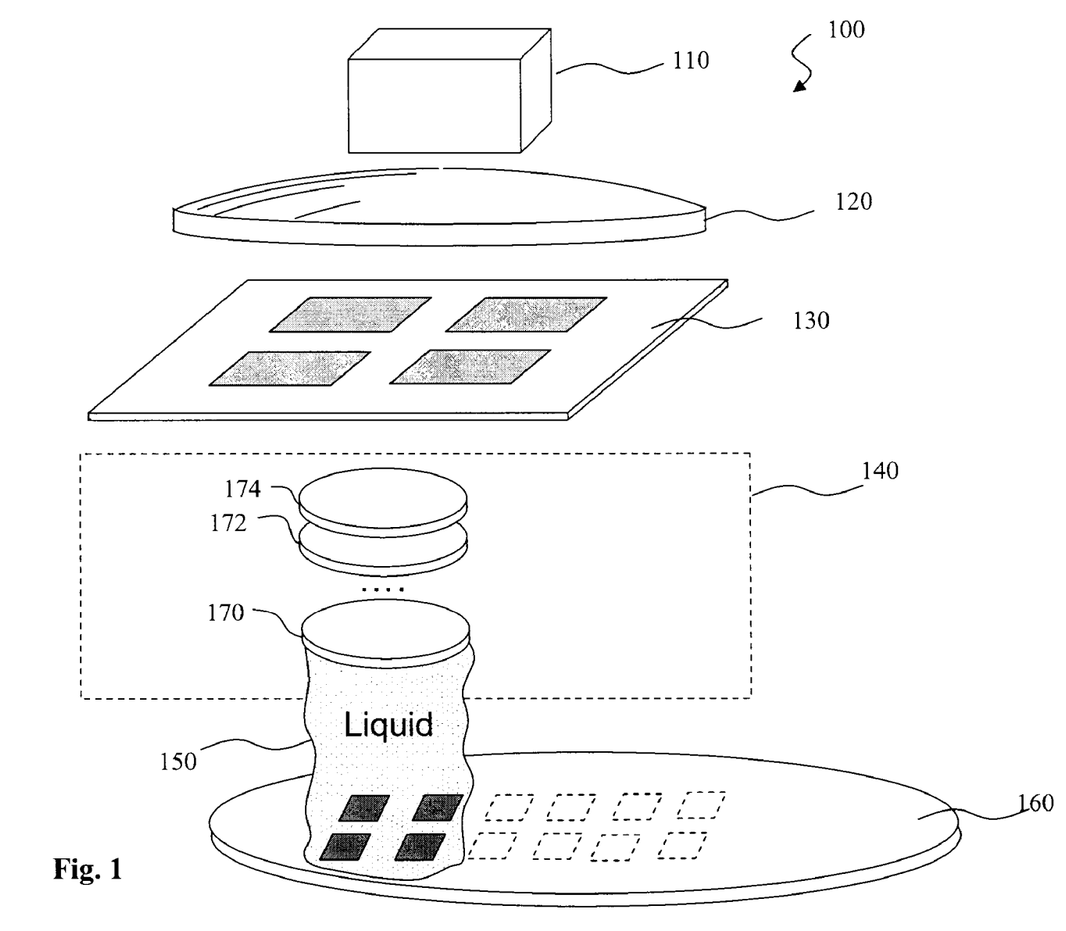
FIG. 1 is a schematic view of an exemplary liquid immersion lithography system using an objective lens having a protective coating.

Referring to FIG. 1, in one embodiment, a liquid immersion lithography system 100 includes a light source 110, an illumination system (e.g., a condenser) 120, a photomask 130, and an objective lens 140. An immersion liquid 150 may be used with the system 100 to aid in the formation of a pattern on a semiconductor substrate 160.

The light source 110 may be any suitable light source. For example, the light source 110 may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other light sources having a wavelength below approximately 100 nm.

In lithography systems with wavelengths below approximately 157 nm, various system components may demonstrate a high level of absorption. This may be solved by some extent with the use of reflective optics, but these optics may introduce other challenges. Immersion lithography may be used to reduce feature sizes in lithography while addressing some of the concerns with wavelengths below 157 nm. It is understood that in the above description of light sources, each light source may have a certain wavelength distribution, or line width, rather than an exact single wavelength. For example, the I-line (e.g., 365 nm) wavelength of the mercury lamp may not be exactly 365 nm, but may be centered at approximately 365 nm with a range of varying wavelengths extending above and below 365 nm. This range may be used to determine a minimum possible line width during photolithography, with less variation from the desired 365 nm wavelength resulting in a thinner line width.

The illumination system (e.g., the condenser) 120 may comprise a single lens or may comprise a lens system having multiple lenses and/or other lens components. For example, the illumination system may comprise microlens arrays, shadow masks, or other structures designed to aid in directing light from the light source 110 onto the photomask 130.

The photomask 130 may comprise a transparent substrate and an absorption layer. The transparent substrate may use fused silica ($SiO_2$) relatively free of defects, such as borosilicate glass and soda-lime glass. The absorption layer may be formed using a number of different processes and materials, such as depositing a metal film made with chromium (Cr) oxide and iron oxide, or an inorganic film made with MoSi, ZrSiO, SiN, and/or TiN. The absorption layer may be patterned to have one or more openings through which light may travel without being absorbed by the absorption layer.

The objective lens 140 may comprise a single lens or a plurality of lens elements illustrated as 170, 172, 174. As will be described later in greater detail, each lens element may include a transparent substrate and may have an anti-reflection coating (ARC) on at least one surface of each lens element. The transparent substrate may be a conventional objective lens, and may be made of fused silica ($SiO_2$), calcium-fluoride ($CaF_2$), lithium fluoride (LiF), or barium fluoride ($BaF_2$). The materials used for each lens element may be chosen based on the wavelength of light used in the lithography process to lessen absorption and scattering.

At least one lens element may also have a protective coating (PC) to minimize or prevent corrosion (e.g., a chemical reaction between the lens 140 and the immersion liquid 150), erosion (e.g., a physical or mechanical bubble of liquid at the lens), dissolution of the lens and liquid, or other of the objective lens 140 by the immersion liquid 150. If the immersion liquid 150 is corrosive, the lens element 170 may have an asymmetric coating. For example, the lens element 170 may have an ARC on one surface and a protective coating on the surface that is proximate to or in contact with the immersion liquid 150. In the present example, the lens element 170 of the objective lens 140 may be in direct contact with the immersion liquid 150. The immersion liquid 150 may be selected both for optical qualities and for compatibility with the semiconductor substrate 160. For example, the immersion liquid 150 may be selected to minimize chemical reactions, scattering, and light absorption, as well as to be relatively bubble-free and thermally stable during lithography. Water may be used, as may other liquids.

Due to the possible high index of the immersion liquid 150, such as with an organic fluid or a non-water containing fluid, the friction between the immersion liquid 150 and one or more of the lens elements could be relatively high. Moreover, lens cleaning may be necessary by using various solvents to remove the residue of fluid, e.g., a by-product from the photoresist and/or other particles from the process. A protective coating layer can be used for lens protection from any mechanical and/or chemical interaction with the immersion liquid 150 or other material.

The semiconductor substrate 160 may be a wafer comprising an elementary semiconductor such as crystal silicon, polycrystalline silicon, amorphous silicon, germanium, and diamond, a compound semiconductor such as silicon carbide and gallium arsenic, an alloy semiconductor such as SiGe, GaAsP, AlInAs, AlGaAs, and GaInP, or any combination thereof.

Figure 2:
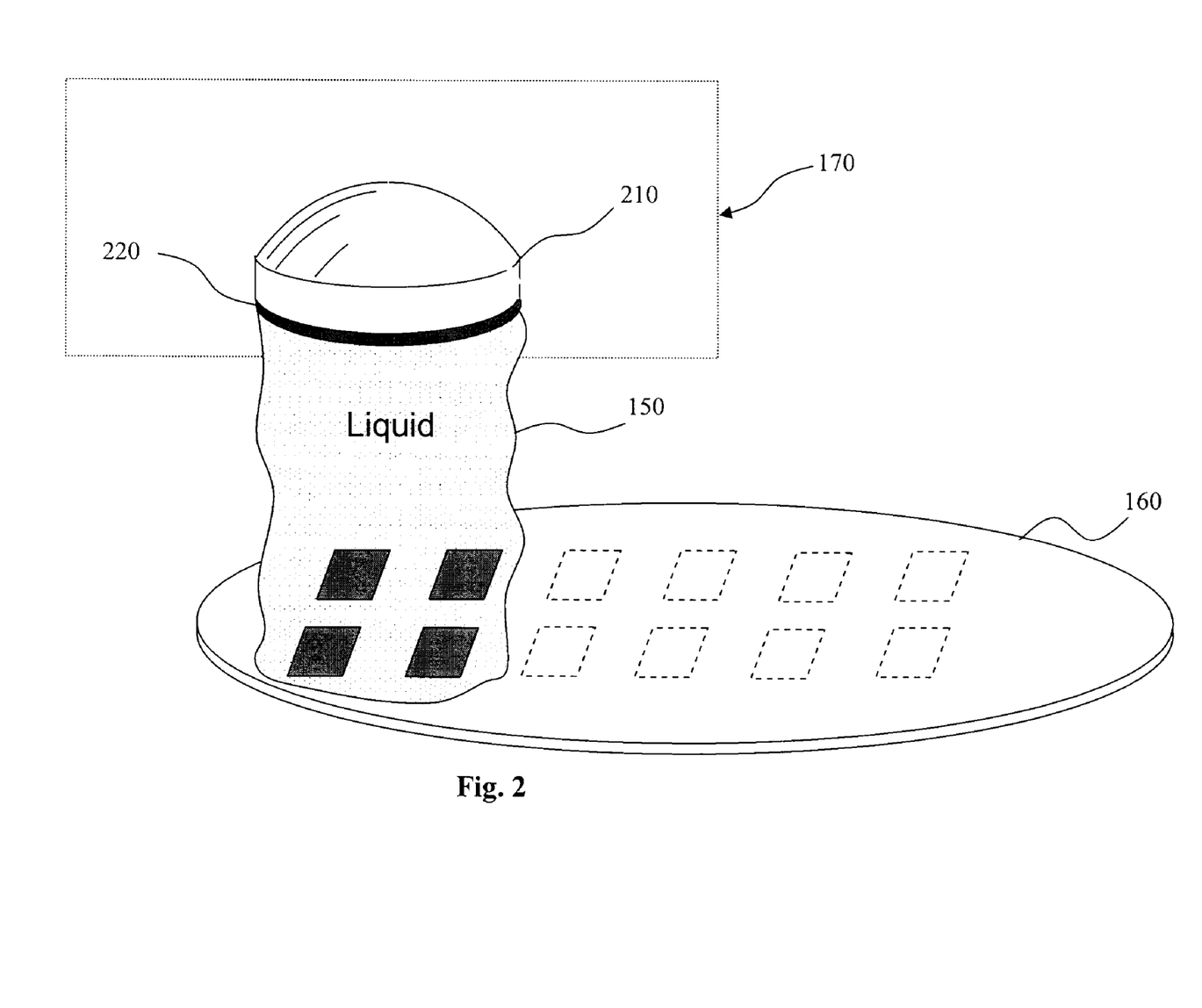
FIG. 2 is a schematic view of one embodiment of the objective lens of FIG. 1 having the protective coating.

Referring now to FIG. 2, one embodiment of the lens element 170 of FIG. 1 is illustrated with a transparent substrate 210 and a protective coating (PC) 220. The transparent substrate 210 may be a conventional lens, and may be include of fused silica ($SiO_2$), calcium-fluoride ($CaF_2$), lithium fluoride (LiF), barium fluoride ($BaF_2$), or another material. In some embodiments, the material may be chosen based on the wavelength of light used in the lithography process.

The PC 220 may be formed either directly on or proximate to (if there are intervening layers) the transparent substrate 210. The material forming the PC 220 may be selected to adhere relatively well to the transparent substrate 210, to be transparent to the light used during lithography, and to be chemically stable with the immersion liquid 150. It is understood that the material may change depending on the particular immersion liquid used during lithography. In the present example, chemically stable indicates that the chemical reaction rate between the PC 220 and the immersion liquid is less than $10^{-5}$ per hour, where the chemical reaction rate is defined as the decrease of the relative thickness of the PC 220 per hour. The chemical stability of the PC 220 in the immersion liquid 150 enables the PC to protect the lens element 170 of the objective lens 140 from damage by the immersion liquid or corresponding substances. Accordingly, the resolution of lithography may be maintained while prolonging the lifetime of the objective lens 140.

As one example, $SiO_2$ may be used for the PC 220 when the transparent substrate 210 is formed of $CaF_2$, LiF, or $BrF_2$. $SiO_2$ is compatible with water used as the immersion liquid 150. Other materials that may be used for the PC 220 include indium tin oxide (ITO), polymer, and the non-photo-active resin of a photoresist.

In the present example, the thickness of the PC 220 may be less than 1000 μm, and the surface flatness of the PC 220 may be controlled so that the variation of the surface is less than the half of the wavelength of the light used in lithography. In some embodiments, the thickness of the PC 220 may be increased within a range of up to approximately 1 mm, enabling the PC 220 to perform both protective and anti-reflection functions. The deposition of the PC 220 may be implemented by spin-on coating, chemical vapor deposition (CVD), atomic layer deposition (ALD), physical vapor deposition (PVD) such as sputtering and evaporation, or epitaxy growth.

Figure 3:
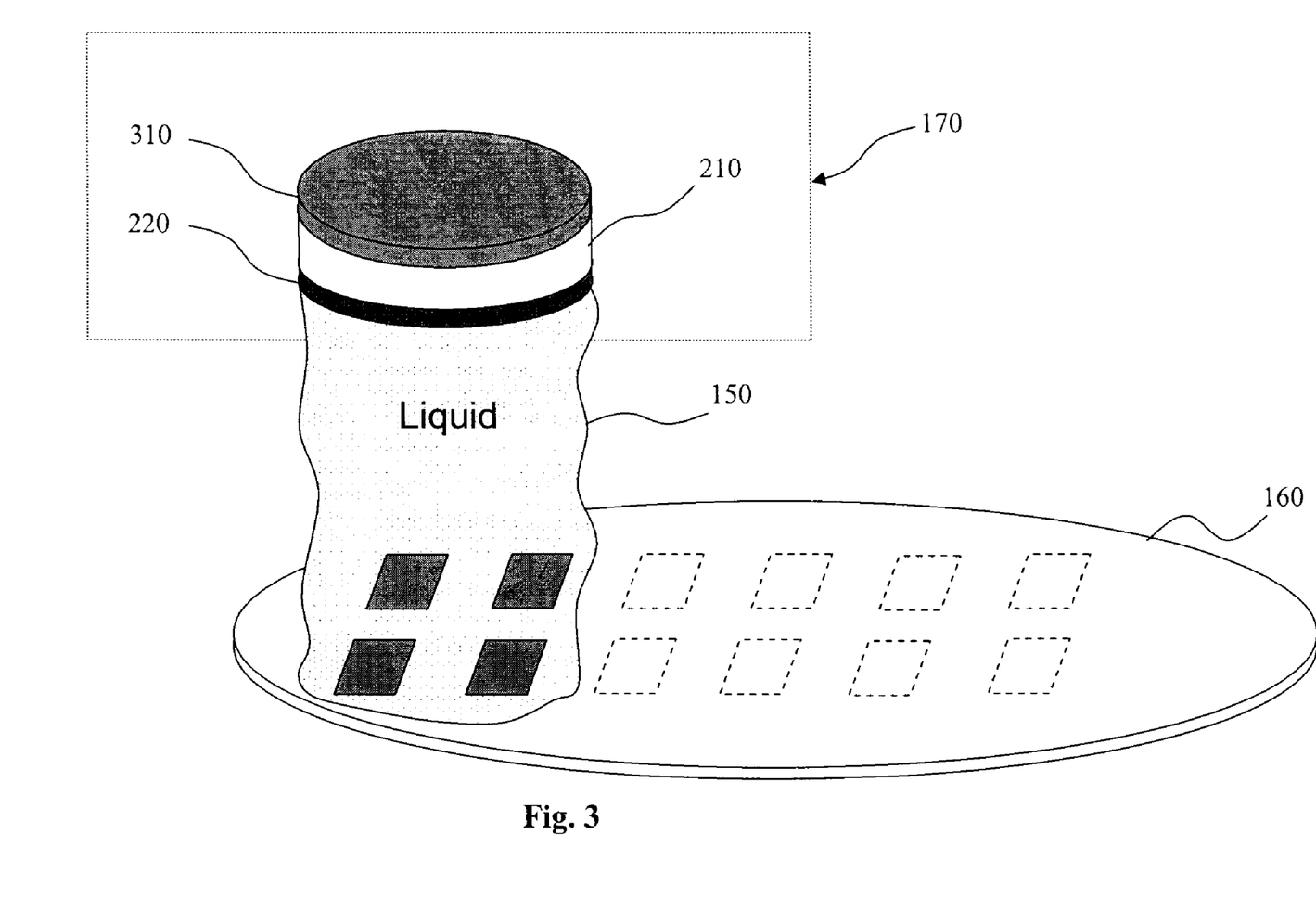
FIG. 3 is a schematic view of another embodiment of the objective lens of FIG. 1 having the protective coating on one surface and a protective coating on the opposite surface.

Referring now to FIG. 3, another embodiment of the lens element 170 is illustrated with the transparent substrate 210, the PC 220, and an ARC 310. In the present example, the ARC 310 is positioned proximate to the transparent substrate 210 on the side opposite the PC 220. The ARC 310 may have a multilayer structure or a graded structure where the refractive index of the ARC changes gradually to match the refractive indexes of neighboring materials. The ARC 310 may use an organic material containing at least one of hydrogen, carbon, and oxygen; compound materials including $MgF_2$, SiO, $Cr_2O_3$, ITO, $SiO_2$, SiN, $TaO_5$, $Al_2O_3$, TiN, and ZrO; metal materials such as Al, Ag, Au, and In; or a combination thereof.

Figure 4:
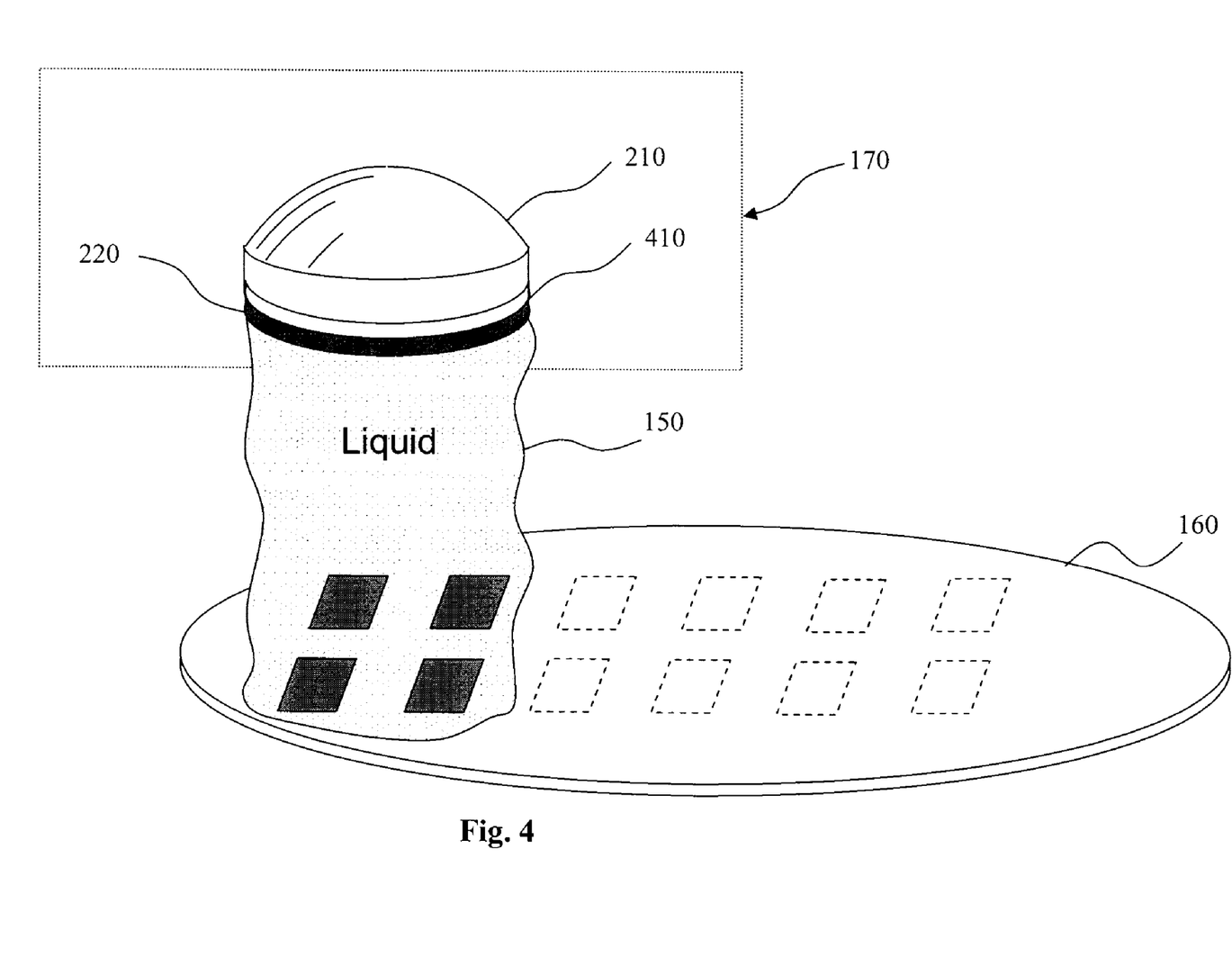
FIG. 4 is a schematic view of yet another embodiment of the objective lens of FIG. 1 having the protective coating and an anti-reflection coating on the same surface.

Referring now to FIG. 4, still another embodiment of the lens element 170 is illustrated with the transparent substrate 210, the PC 220, and an ARC 410. In the present example, the ARC 410 is positioned between the transparent substrate 210 and the PC 220. The ARC 410 may have a multilayer structure or a graded structure where the refractive index of the ARC changes gradually to match the refractive indexes of neighboring materials. The ARC 410 may use an organic material containing at least one of hydrogen, carbon, and oxygen; compound materials including $MgF_2$, SiO, $Cr_2O_3$, ITO, $SiO_2$, SiN, $TaO_5$, $Al_2O_3$, TiN, and ZrO; metal materials such as Al, Ag, Au, and In; or a combination thereof.

Figure 5:
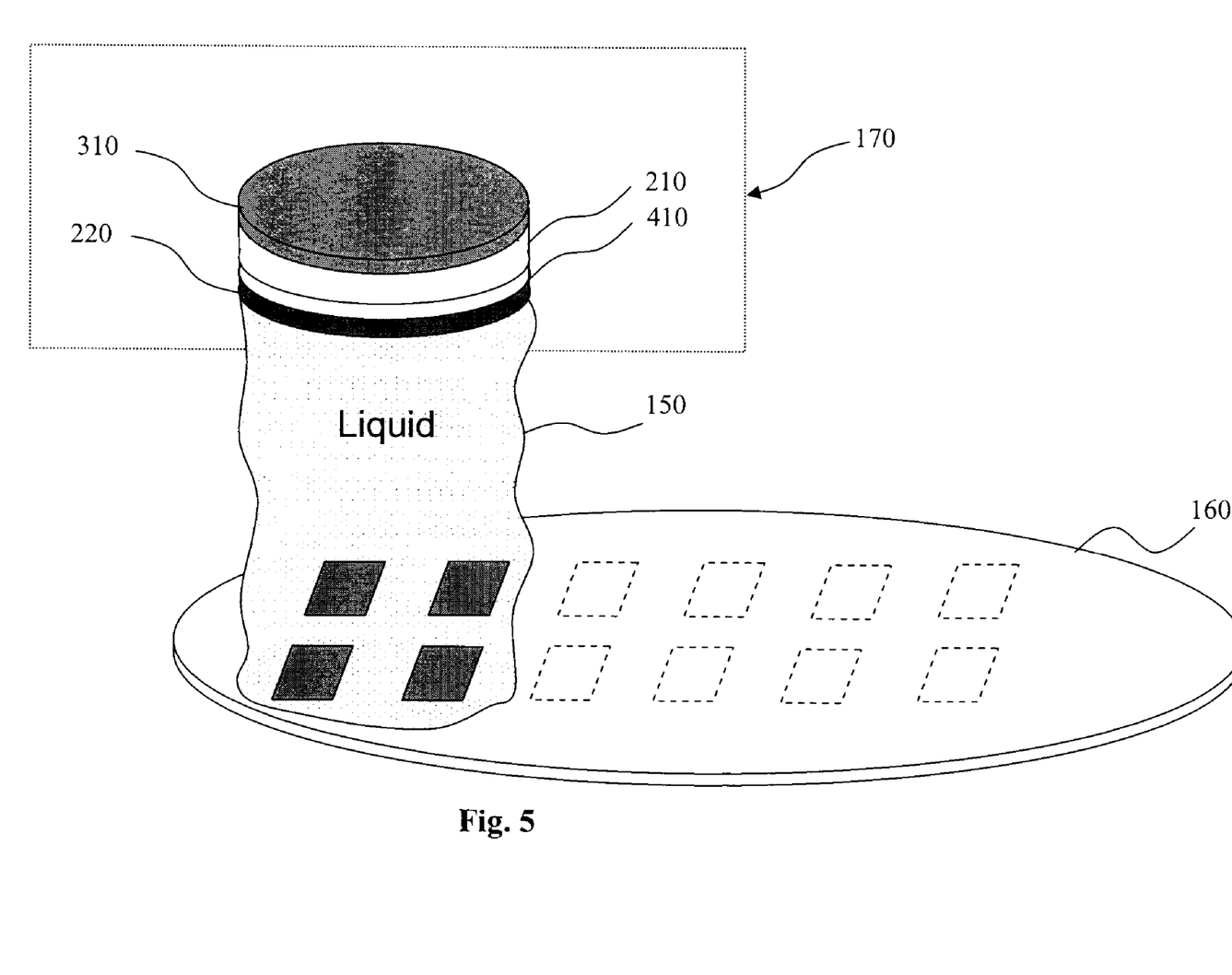
FIG. 5 is a schematic view of still another embodiment of the objective lens of FIG. 1 having the protective coating and a first anti-reflection coating on one surface and a second anti-reflection coating on the opposite surface.

Referring now to FIG. 5, yet another embodiment of the lens element 170 is illustrated with the transparent substrate 210, the PC 220, and the two ARCs 310, 410. In the present example, the ARC 310 is positioned proximate to the transparent substrate 210 on the side opposite the PC 220, and the ARC 410 is positioned between the transparent substrate 210 and the PC 220. One or both ARCs 310, 410 may have a multilayer structure or a graded structure where the refractive index of the ARC changes gradually to match the refractive indexes of neighboring materials. In addition, one or both ARCs 310, 410 may use an organic material containing at least one of hydrogen, carbon, and oxygen; compound materials including $MgF_2$, SiO, $Cr_2O_3$, ITO, $SiO_2$, SiN, $TaO_5$, $Al_2O_3$, TiN, and ZrO; metal materials such as Al, Ag, Au, and In; or a combination thereof.

Figure 6:
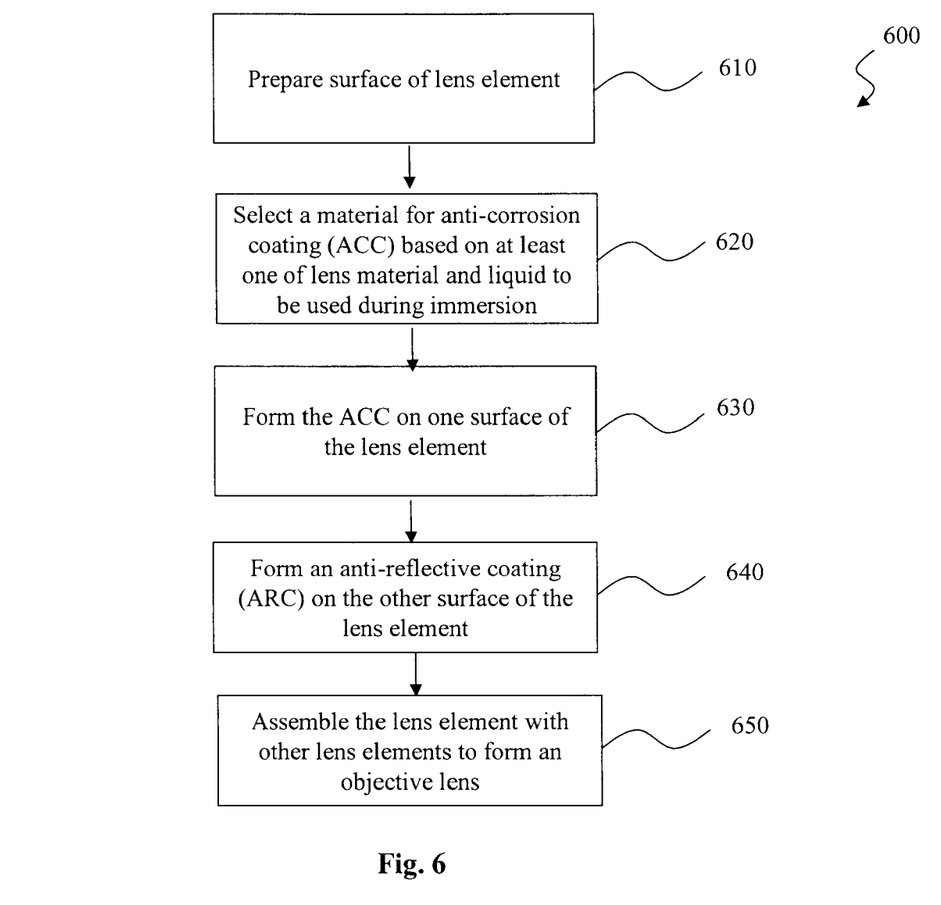
FIG. 6 is a flow chart of an exemplary method for making a lens element having a protective coating.

Referring to FIG. 6, in another embodiment, a method 600 may be used to fabricate the objective lens 140 of FIG. 1 or a lens element, such as the lens element 170 of FIGS. 2-5. In the present example, the method 600 is illustrated with respect to lens element 170 of FIG. 3. In step 610, a surface of the lens element 170 is prepared. The preparation may include a sequence of polishing and cleaning, and may use mechanical, chemical, and/or other surface preparation methods.

In step 620, a material for an PC (e.g., the PC 220 of FIG. 3) is selected based on one or both of the immersion liquid with which the lens element 170 is to be used and the material of the lens element 170. For example, if the lens element 170 comprises $CaF_2$, LiF, or $BrF_2$ and water is to be used as the immersion liquid, then $SiO_2$ may be selected as the PC material. Other materials that may be used for the PC 220 include indium tin oxide (ITO), polymer, and the non-photo-active resin of a photoresist.

In step 630, the PC is formed on one surface of the lens element 170. The PC may be formed either directly on or proximate to (if there are intervening layers) the transparent substrate. The material forming the PC may be selected to adhere relatively well to the transparent substrate, to be transparent to the light used during lithography, and to be chemically stable with the immersion liquid 150. It is understood that the material may change depending on the particular immersion liquid used during lithography. In the present example, chemically stable indicates that the chemical reaction rate between the PC and the immersion liquid is less than $10^{-5}$ per hour, where the chemical reaction rate is defined as the decrease of the relative thickness of the PC 220 per hour.

In the present example, the thickness of the PC may be less than 1000 μm, and the surface flatness of the PC may be controlled so that the variation of the surface is less than the half of the wavelength of the light used in lithography. In some embodiments, the thickness of the PC may be increased within a range of up to approximately 1 mm, enabling the PC to perform anti-corrosion, anti-erosion, anti-dissolution, anti-reflection and other functions. The formed PC may be planarized through processing such as polishing.

In step 640, an ARC (e.g., the ARC 310 of FIG. 3) may be formed on the opposite surface relative to the PC of the lens element 170 of the objective lens. The ARC may have multilayer structure, or may have a graded structure where the refractive index of the ARC may change gradually to match the refractive indexes of neighboring materials. The ARC may comprise organic material containing at least one of hydrogen, carbon, and oxygen; compound materials including $Cr_2O_3$, ITO, $SiO_2$, SiN, $TaO_5$, $Al_2O_3$, TiN, and ZrO; metal materials such as Al, Ag, Au, and In; or combination of thereof. It is understood that the ARC may not be used on the lens element 170, or may be formed on the surface prior to forming the PC on the same surface (e.g., FIG. 4).

In step 650, the lens element 170 with its PC and ARC may be assembled with other lens elements into an objective lens. It is understood that such assembly may not be required. For example, the lens element may be used alone or may already be part of an objective lens when one or both of the PC and ARC are formed. Other lens elements used with the lens element 170 may or may not have an PC or an ARC.

Figure 7:
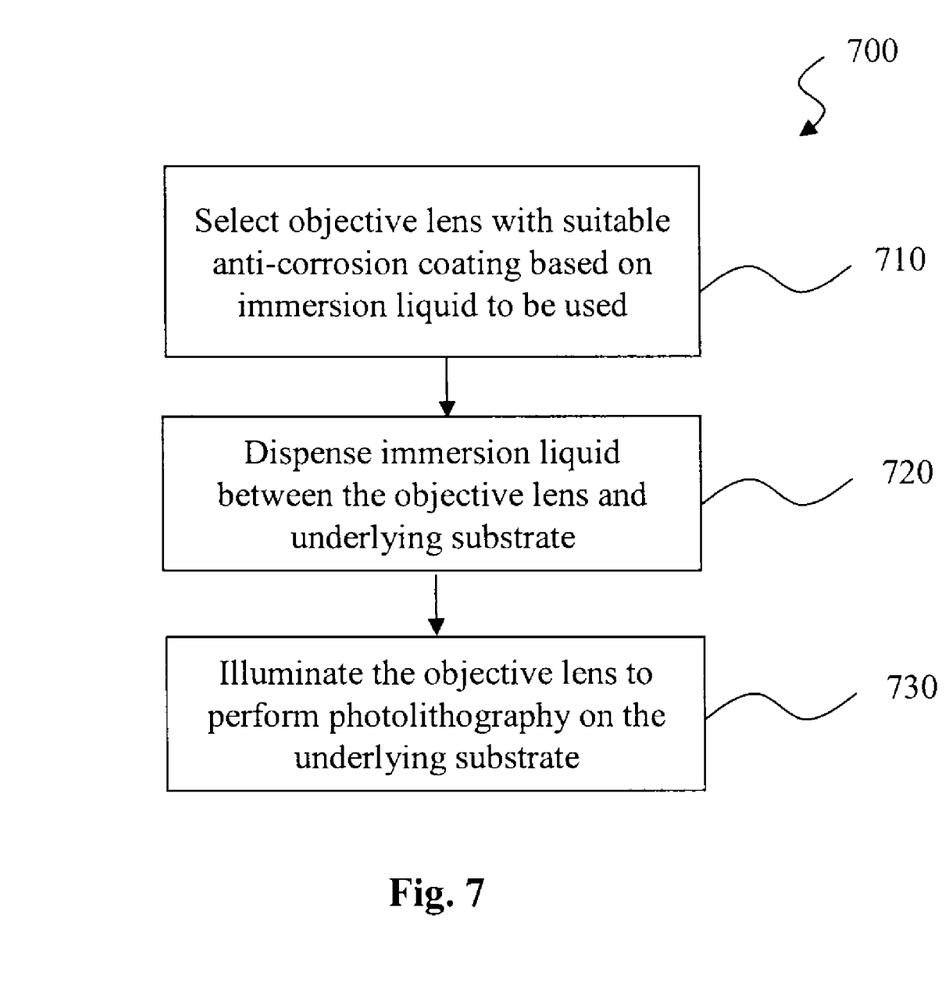
FIG. 7 is a flow chart of an exemplary method for using a lens having a protective coating.

Referring to FIG. 7, a method 700 illustrates an exemplary use of the objective lens 170 of FIGS. 1-5 during liquid immersion lithography. In step 710, an objective lens having a suitable PC is selected based at least partly on a liquid to be used during the immersion lithography. As the PC is to protect or minimize corrosion of the lens by the immersion liquid, the material used to form the PC should be a factor in selecting an objective lens. An exemplary immersion liquid may have an index of refraction larger than one, relatively low optical absorption at a predetermined wavelength such as 193 nm, and may be compatible with a photoresist applied to the semiconductor substrate. In addition, the immersion liquid may be relatively chemically stable, uniform, non-contaminating, bubble-free, and thermally stable. As an example, pure water may be used as an immersion liquid. Further, the temperature of the immersion liquid may be controlled due to its effect on shifting the index of refraction.

At step 720, the immersion liquid is dispensed between the substrate to be patterned and the objective lens, with the objective lens positioned with the PC close to or in contact with the immersion liquid. In some embodiments, the objective lens may be at least partly held in position by the surface tension of the immersion liquid.

At step 730, the objective lens is illuminated to perform lithography on the substrate. The illuminating light may include a predetermined wavelength of light in the range between about 100 nm and about 500 nm. For example, the illuminating light may be from a mercury lamp with a wavelength of 436 nm (G-line) or 365 nm (I-line); a Krypton Fluoride (KrF) excimer laser with a wavelength of 248 nm; an Argon Fluoride (ArF) excimer laser with a wavelength of 193 nm; or a Fluoride ($F_2$) excimer laser with a wavelength of 157 nm. Alternatively, a 193 nm ArF excimer laser may be used in liquid immersion lithography to enhance the resolution of the pattern.

Due to the possible high index fluid, e.g., organic fluid or non-water containing fluid may be adopted in future, the friction between the immersion liquid 150 and the lens element 170 can be relatively higher. Moreover, lens cleaning may be necessary by using various solvents to remove the residue of fluid, such as the by-product from PR, the immersion fluid 150 and/or other particles from the lithography process. The protective coating (PC) 220 can be used for lens protection from the mechanical/chemical interaction with fluids and/or other material. In addition or in the alternative, the PC 220 can also be used to prevent corrosion.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. An immersion photolithography system, comprising:
   a lens adapted for illumination by a predetermined wavelength of light during liquid immersion photolithography of a semiconductor wafer, the lens comprising:
   a transparent substrate having a first side and a second side, wherein the second side is substantially opposite the first side;

a first layer of antireflection coating (ARC), the first layer of ARC formed on the first side of the transparent substrate and defining an outer surface of the lens, the first layer of ARC defining the outer surface of the lens being positioned closer to a light source for illuminating the lens than any other portion of the lens;

a second layer of ARC, the second layer of ARC formed on the second side of the transparent substrate; and a layer of protective coating (PC) formed on the second layer of ARC, wherein the PC is positioned between a liquid used in the liquid immersion photolithography and the transparent substrate, the system configured such that the PC is in contact with an immersion liquid during the liquid immersion photolithography of a semiconductor device to protect the transparent substrate from the liquid, wherein the PC is an anti-corrosion layer.

2. The immersion photolithography system of claim 1 wherein the transparent substrate is selected from the group consisting of $CaF_2$, $SiO_2$, LiF, and $BaF_2$.

3. The immersion photolithography system of claim 1 wherein the PC is selected from the group consisting of $SiO_2$, indium tin oxide, and polymer.

4. The immersion photolithography system of claim 1 wherein the predetermined wavelength of light is either substantially 248 nm or substantially 193 nm.

5. The immersion photolithography system of claim 1 wherein the PC has a thickness less than about 1000 μm.

6. The immersion photolithography system of claim 1 wherein a fluctuation of surface flatness of the PC is less than half of the predetermined wavelength of light.

7. The immersion photolithography system of claim 1 wherein the PC has a chemical reaction rate with the liquid used in immersion photolithography of less than $10^{-5}$ per hour.

8. The immersion photolithography system of claim 1 wherein the ARC has a graded, multiple layer structure.

9. The immersion photolithography system of claim 1 wherein the ARC includes a compound material selected from the group consisting of $MgF_2$, SiO, $Cr_2O_3$, ITO, $SiO_2$, SiN, $TaO_5$, $Al_2O_3$, TiN, ZrO, and combinations thereof.

10. The immersion photolithography system of claim 1, wherein the first side of the transparent substrate only includes the first layer of ARC formed thereon.

11. A liquid immersion photolithography system comprising:

an objective lens for patterning a substrate, the objective lens having a front surface and a back surface;

a liquid positioned between the back surface of the objective lens and the substrate;

a protective coating (PC) adjacent to the back surface of the objective lens, wherein the PC includes an anti-corrosion layer;

a first layer of antireflection coating (ARC) between the back surface of the objective lens and the PC;

a second layer of ARC over the front surface of the objective lens; and a light source for illuminating the front surface of the objective lens to perform photolithography on the underlying substrate, wherein the second layer of ARC is positioned closer to the light source than any other portion of the objective lens.

12. The liquid immersion photolithography system of claim 11 wherein the objective lens includes at least one material from the group consisting of $CaF_2$, LiF and $BaF_2$.

13. The liquid immersion photolithography system of claim 11 wherein the PC is selected from the group consisting of $SiO_2$, indium tin oxide and polymer.

14. The liquid immersion photolithography system of claim 11 wherein the liquid between the PC and underlying substrate is at least one of an organic or non-water containing fluid.

15. The liquid immersion photolithography system of claim 11 wherein the first and second layers of ARC have a multiple layer structure.

16. The liquid immersion photolithography system of claim 11 wherein the first and second layers of ARC are a compound material selected from the group consisting of organic, $MgF_2$, SiO, $Cr_2O_3$, ITO, $SiO_2$, SiN, $TaO_5$, $Al_2O_3$, TiN, ZrO, and combination thereof.

17. The liquid immersion photolithography system of claim 11 wherein the light source provides a radiation with a wavelength between about 100 nm and about 500 nm.

18. The liquid immersion photolithography system of claim 11 wherein the PC has a thickness less than about 1000 μm.

19. An immersion lithography system for patterning a semiconductor substrate using an objective lens having a front surface and a back surface, the objective lens having a protective coating (PC) over the back surface, a first layer of antireflection coating (ARC) between the back surface of the objective lens and the PC, surface of the objective lens relative to the PC, and a second layer of ARC over the front surface of the objective lens, the system comprising:

the protective coating configured to be responsive to a liquid used in a liquid immersion photolithography process, and wherein the protective coating provides an anti-corrosion property;

the selected liquid positioned between the objective lens and the semiconductor substrate, wherein the objective lens is positioned with the PC in contact with the liquid;

an illumination system for illuminating the objective lens to perform photolithography on the semiconductor substrate;

wherein the second layer of ARC forms an outer surface of the objective lens, the second layer of ARC forming the outer surface of the objective lens being positioned closer to a light source of the illumination system than any other portion of the objective lens.

20. The system of claim 19 wherein the protective coating is selected from a group consisting of $CaF_2$, $SiO_2$, LiF, and $BaF_2$.

21. The system of claim 19 wherein the liquid is at least one of an organic fluid and non-water containing fluid.

22. The system of claim 19 wherein the predetermined wavelength of light is either substantially 248 nm or substantially 193 nm.

23. The system of claim 19 wherein the protective coating has a thickness less than about 1000 μM.

24. The system of claim 19 wherein the first and second layers of ARC have a multiple layer structure.

25. The system of claim 19 wherein the ARC includes a compound material selected from a group consisting of $MgF_2$, SiO, $Cr_2O_3$, ITO, $SiO_2$, SiN, $TaO_5$, $Al_2O_3$, TiN, ZrO, and combination thereof.

26. The system of claim 19 wherein the illumination system provides a light in a range between about 100 nm and about 500 nm.

* * * * *